United States Patent
Shih

(10) Patent No.: US 9,607,967 B1
(45) Date of Patent: Mar. 28, 2017

(54) MULTI-CHIP SEMICONDUCTOR PACKAGE WITH VIA COMPONENTS AND METHOD FOR MANUFACTURING THE SAME

(71) Applicant: INOTERA MEMORIES, INC., Taoyuan (TW)

(72) Inventor: Shing-Yih Shih, New Taipei (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 14/977,645

(22) Filed: Dec. 22, 2015

Related U.S. Application Data

(63) Continuation-in-part of application No. 14/931,862, filed on Nov. 4, 2015.

(51) Int. Cl.
*H01L 25/065* (2006.01)
*H01L 23/552* (2006.01)
*H01L 23/31* (2006.01)
*H01L 23/00* (2006.01)

(52) U.S. Cl.
CPC ...... *H01L 25/0657* (2013.01); *H01L 23/3157* (2013.01); *H01L 23/552* (2013.01); *H01L 24/02* (2013.01); *H01L 2224/02372* (2013.01); *H01L 2225/0652* (2013.01); *H01L 2225/06537* (2013.01); *H01L 2225/06544* (2013.01)

(58) Field of Classification Search
CPC .............. H01L 25/0657; H01L 23/552; H01L 23/3157; H01L 24/02
See application file for complete search history.

(56) References Cited

U.S. PATENT DOCUMENTS

| | | | |
|---|---|---|---|
| 7,825,024 B2* | 11/2010 | Lin | H01L 21/76898 257/621 |
| 7,838,337 B2 | 11/2010 | Marimuthu | |
| 8,030,747 B2* | 10/2011 | Lee | H01L 23/3128 257/686 |
| 8,310,038 B2* | 11/2012 | Kim | H01L 25/105 257/666 |
| 8,531,032 B2* | 9/2013 | Yu | H01L 23/3114 257/738 |
| 8,674,513 B2 | 3/2014 | Yu | |
| 9,123,763 B2* | 9/2015 | Yu | H01L 21/568 |
| 9,214,454 B2 | 12/2015 | Haba | |
| 2015/0115466 A1 | 4/2015 | Kim | |
| 2015/0206866 A1 | 7/2015 | Yu | |
| 2015/0287672 A1* | 10/2015 | Yazdani | H01L 21/486 257/414 |
| 2016/0027764 A1 | 1/2016 | Kim | |

* cited by examiner

*Primary Examiner* — William Coleman
(74) *Attorney, Agent, or Firm* — Winston Hsu; Scott Margo

(57) ABSTRACT

A multi-chip semiconductor package includes a lower RDL interposer, a first chip on the lower RDL interposer within a chip mounting area, via components mounted within a peripheral area, and a first molding compound surrounding the first chip and the via components. Each of the via components comprises a substrate portion and a connection portion coupled to the substrate portion. An upper RDL interposer is integrally constructed on the first chip, on the via components, and on the first molding compound. The upper RDL interposer is electrically connected to the connection portion of each of the via components. A second chip is mounted on the upper RDL interposer. A second molding compound surrounds the second chip.

19 Claims, 15 Drawing Sheets

MULTI-CHIP SEMICONDUCTOR PACKAGE WITH VIA COMPONENTS AND METHOD FOR MANUFACTURING THE SAME

CROSS REFERENCE TO RELATED APPLICATIONS

This application is a continuation-in-part of U.S. application Ser. No. 14/931,862 filed, Nov. 4, 2015, which is included in its entirety herein by reference.

BACKGROUND OF THE INVENTION

1. Field of the Invention

The present disclosure relates generally to the field of semiconductor packaging, and more particularly, to a multi-chip (or multi-die) semiconductor package utilizing pre-fabricated via components. A method for manufacturing the multi-chip semiconductor package utilizing such pre-fabricated via components is also disclosed.

2. Description of the Prior Art

With recent advancements in the semiconductor manufacturing technology microelectronic components are becoming smaller and circuitry within such components is becoming increasingly dense. To reduce the dimensions of such components, the structures by which these components are packaged and assembled with circuit boards must become more compact.

In order to meet the requirements of smaller footprints with higher densities, 3D stacking packaging such as PoP (Package-on-Package) assembly has been developed. Typically, a PoP assembly includes a top package with a semiconductor die bonded to a bottom package with another device die. In PoP designs, the top package is typically interconnected to the bottom package through peripheral solder balls or through mold vias (TMVs).

However, the prior art PoP assembly is not able to provide very tight pitch stacking. Further, the prior art PoP assembly has large package form factor, large package thickness, and poor warpage control. Therefore, there is a need in this industry to provide a fine pitch semiconductor package with reduced form factor and package thickness.

SUMMARY OF THE INVENTION

One object of the present disclosure is to provide a multi-chip semiconductor package to solve the above-mentioned prior art problems.

Another object of the present disclosure is to provide a wafer-level package-on-package (WLPoP) and a method for fabricating such WLPoP.

In one aspect of the disclosure, a multi-chip semiconductor package includes a lower RDL interposer, a first chip mounted on the lower RDL interposer within a chip mounting area, via components mounted within a peripheral area being adjacent to the chip mounting area, a first molding compound surrounding the first chip and the via components. Each of the via components comprises a substrate portion and a connection portion coupled to the substrate portion.

The multi-chip semiconductor package further includes an upper RDL interposer that is integrally constructed on the first chip, on the via components, and also on the first molding compound. The upper RDL interposer is electrically connected to the connection portion of each of the via components. A second chip is mounted on the upper RDL interposer. A second molding compound surrounds the second chip.

According to one embodiment, the second molding compound may be cured at a temperature lower than the glass transition temperature of the first molding compound. According to one embodiment, the second molding compound may have a glass transition temperature that is lower than that of the first molding compound.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
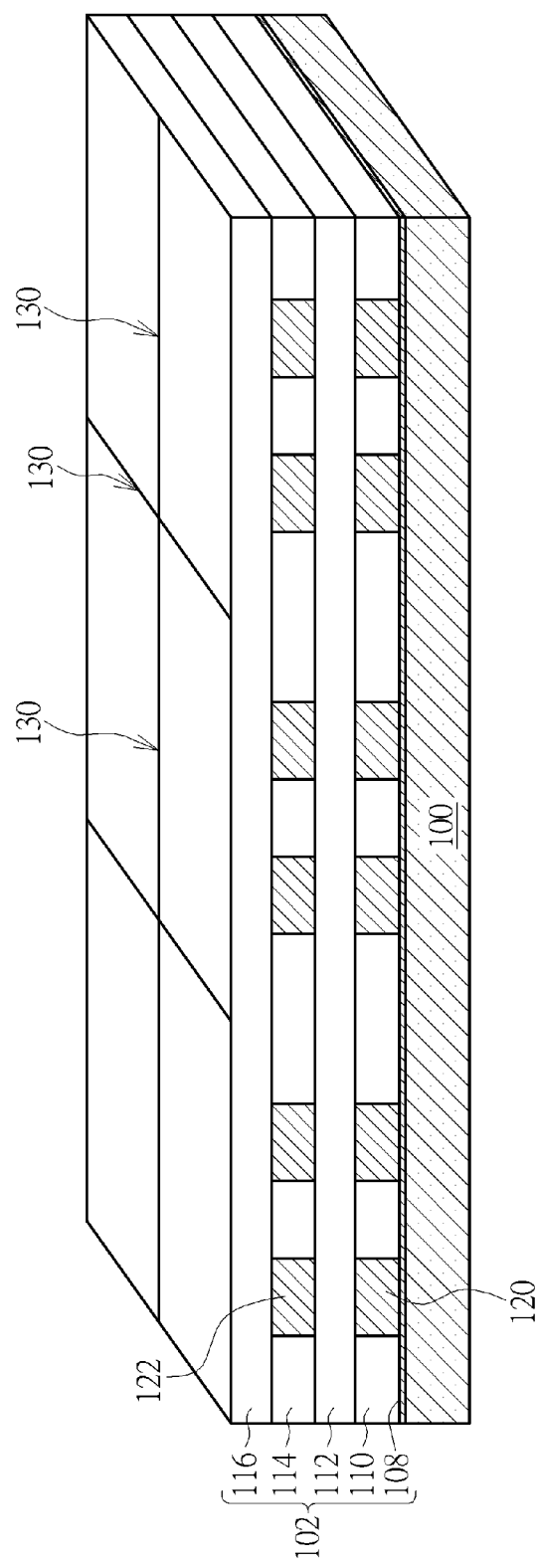
FIG. 1 and FIG. 2 illustrate an exemplary method for forming via components employed in semiconductor packages according to one embodiment.

In the following detailed description, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present disclosure is defined only by the appended claims, along with the full scope of equivalents to which such claims are entitled.

One or more implementations of the present disclosure will now be described with reference to the attached drawings, wherein like reference numerals are used to refer to like elements throughout, and wherein the illustrated structures are not necessarily drawn to scale. The terms "die", "chip", "semiconductor chip", and "semiconductor die" are used interchangeable throughout the specification.

The terms "wafer" and "substrate" used herein include any structure having an exposed surface onto which a layer is deposited according to the present disclosure, for example, to form the circuit structure such as a redistribution layer (RDL). The term "substrate" is understood to include semiconductor wafers, but not limited thereto. The term "substrate" is also used to refer to semiconductor structures during processing, and may include other layers that have been fabricated thereupon.

In one aspect, the present disclosure relates to a via component (or a via chip) and a multi-chip semiconductor package utilizing such a via component. Exemplary methods for fabricating the via component and the multi-chip semiconductor package are also demonstrated.

In another aspect, the present disclosure provides a wafer-level package-on-package (WLPoP) and a method for fabricating such WLPoP. The top package is electrically connected to the bottom package through an upper RDL (or upper RDL interposer) that is integrally formed between the top package and the bottom package in wafer level.

Figure 2:
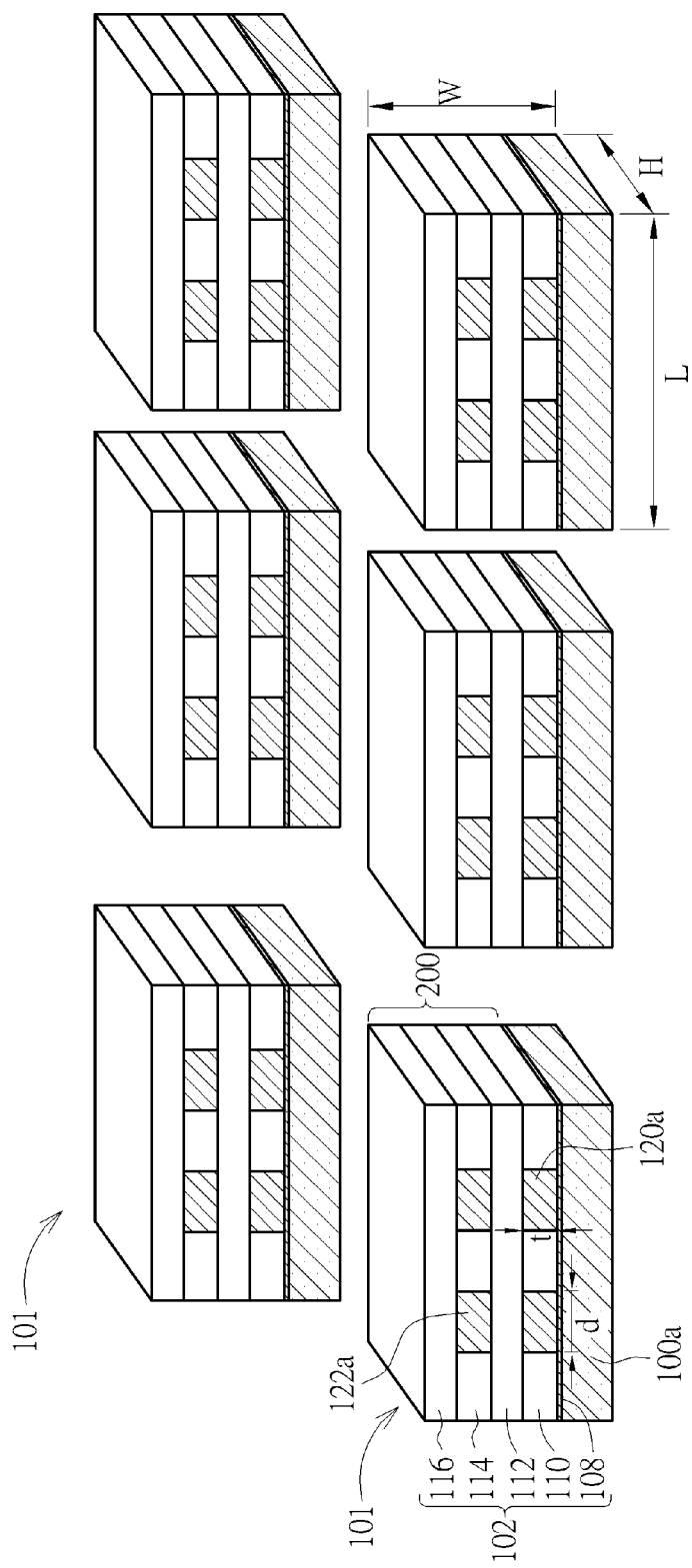

Please refer to FIG. 1 and FIG. 2. FIG. 1 and FIG. 2 illustrate an exemplary method for forming via components employed in a multi-chip semiconductor package or WLPoP according to one embodiment. The pre-fabricated via component (or via chip) is able to provide fine-pitch electrical connection between a top chip and a bottom chip of a multi-chip semiconductor package. The pre-fabricated via component is externally mounted onto a top surface of a re-distribution layer (RDL) interposer around the bottom chip. The substrate portion of each pre-fabricated via component may act as a stiffener that may alleviate or reduce package warpage.

As shown in FIG. 1, a substrate (or a wafer) 100 is provided. According to one embodiment, the substrate 100 may comprise a semiconductor substrate, a metal substrate, a glass substrate, or a ceramic substrate, but not limited thereto. The semiconductor substrate may comprise a silicon substrate. In other embodiments, the substrate 100 may comprise metals or metal alloys. A dielectric stack 102, including, but not limited to, dielectric layers 110, 112, 114, 116, may be formed on a top surface of the substrate 100.

According to one embodiment, the dielectric layers 110, 112, 114, 116 may comprise organic materials or polymeric materials, for example, polyimide (PI), polybenzoxazole (PBO), benzocyclobuten (BCB), but not limited thereto. The dielectric layers 110, 112, 114, 116 may comprise inorganic materials such as silicon oxide, silicon nitride, or silicon oxy-nitride. Optionally, a liner layer 108 such as silicon oxide may be formed on the top surface of the substrate 100 before forming the dielectric layer 110. It is understood that the dielectric stack 102 may comprise an inorganic material, an organic material, or a combination thereof.

According to one embodiment, a plurality of wiring patterns 120 and 122 are formed within the plurality of dielectric layers 110, 112, 114, 116. The wiring patterns 120 and 122 may be parallel-arranged, straight-line shaped wiring patterns. However, it is understood that the wiring patterns 120 and 122 may have other patterns. For example, the plurality of wiring patterns 120 may be formed in the dielectric layer 110, and the plurality of wiring patterns 122 may be formed in the dielectric layer 114.

The wiring patterns 120 and 122 may comprise copper, aluminum, copper-aluminum alloys, titanium, titanium nitride, or the like. For example, the wiring patterns 120 and 122 may be damascened copper wires, but not limited thereto. It is understood that a diffusion barrier such as Ti or TiN (not shown) may be formed depending on the types of metals used. The dielectric layer 116 may act as a cap layer that covers the wiring patterns 122.

According to one embodiment, no via plug is formed in the dielectric layer 112 to electrically connect the wiring patterns 122 with the wiring patterns 120. In other words, according to one embodiment, the wiring patterns 120 and 122 are isolated from one other in the dielectric layers 110, 112, 114, 116.

As shown in FIG. 2, a wafer dicing process is carried out. The substrate 100 having thereon the dielectric layers 110, 112, 114, 116 and the wiring patterns 120 and 122 is diced along the scribe lines 130 and singulated into individual via components 101. After wafer dicing, the wiring patterns 120 and 122 are segmented into metal vias 120a in the dielectric layer 110 and metal vias 122a in the dielectric layer 114, respectively.

Each of the via components 101 comprises a substrate portion 100a and a connection portion 200 coupled to the substrate portion 100a. The connection portion 200 comprises the dielectric stack 102 and the metal vias 120a and 122a. The via component 101 may have a cubic shaped or a rectangular parallelepiped structure. The cubic shaped or rectangular parallelepiped via component 101 has a length L, a width W, and a height H.

According to one embodiment, each of the metal vias 120a and 122a has a line width d that is smaller than 100 micrometers, preferably smaller than 50 micrometers. Each of the metal vias 120a and 122a has a thickness t that is smaller than 100 micrometers, preferably smaller than 50 micrometers. According to one embodiment, each of the metal vias 120a and 122a has a length that amounts to the height H of the cubic shaped via component 101. The two distal end surfaces of each of the metal vias 120a and 122a are exposed from the opposite cut surfaces, which function as contact surfaces for further connection.

According to one embodiment, the metal vias 120a and 122a may function as copper pillars with smaller dimensions for electrical interconnection between a top package and a bottom package. In addition, the via component 101, especially the substrate portion 100a such as a silicon portion of each via component 101, may act as a stiffener that may alleviate or reduce package warpage.

Figure 3:
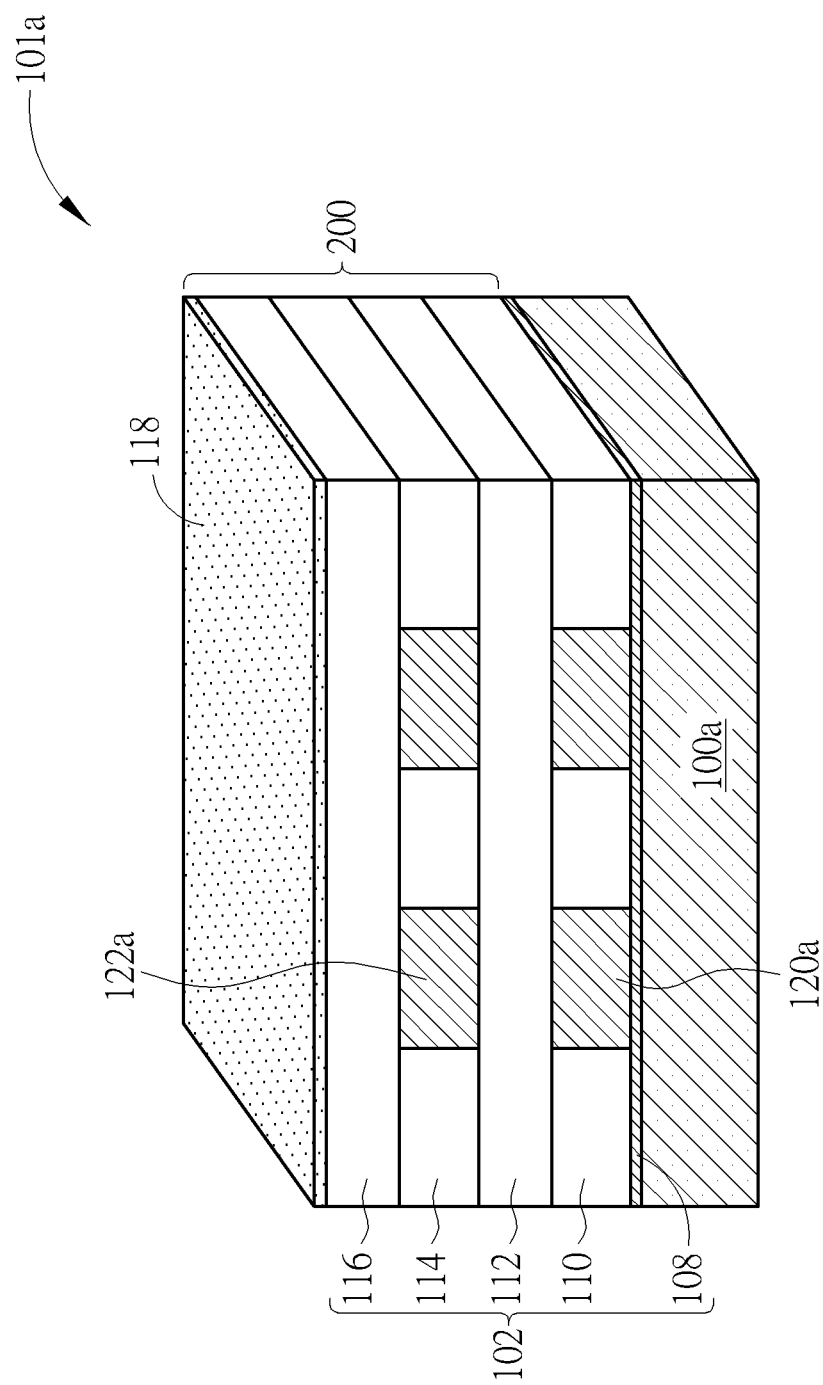
FIG. 3 and FIG. 4 illustrate various exemplary via components employed in semiconductor packages according to other embodiments.
Figure 4:
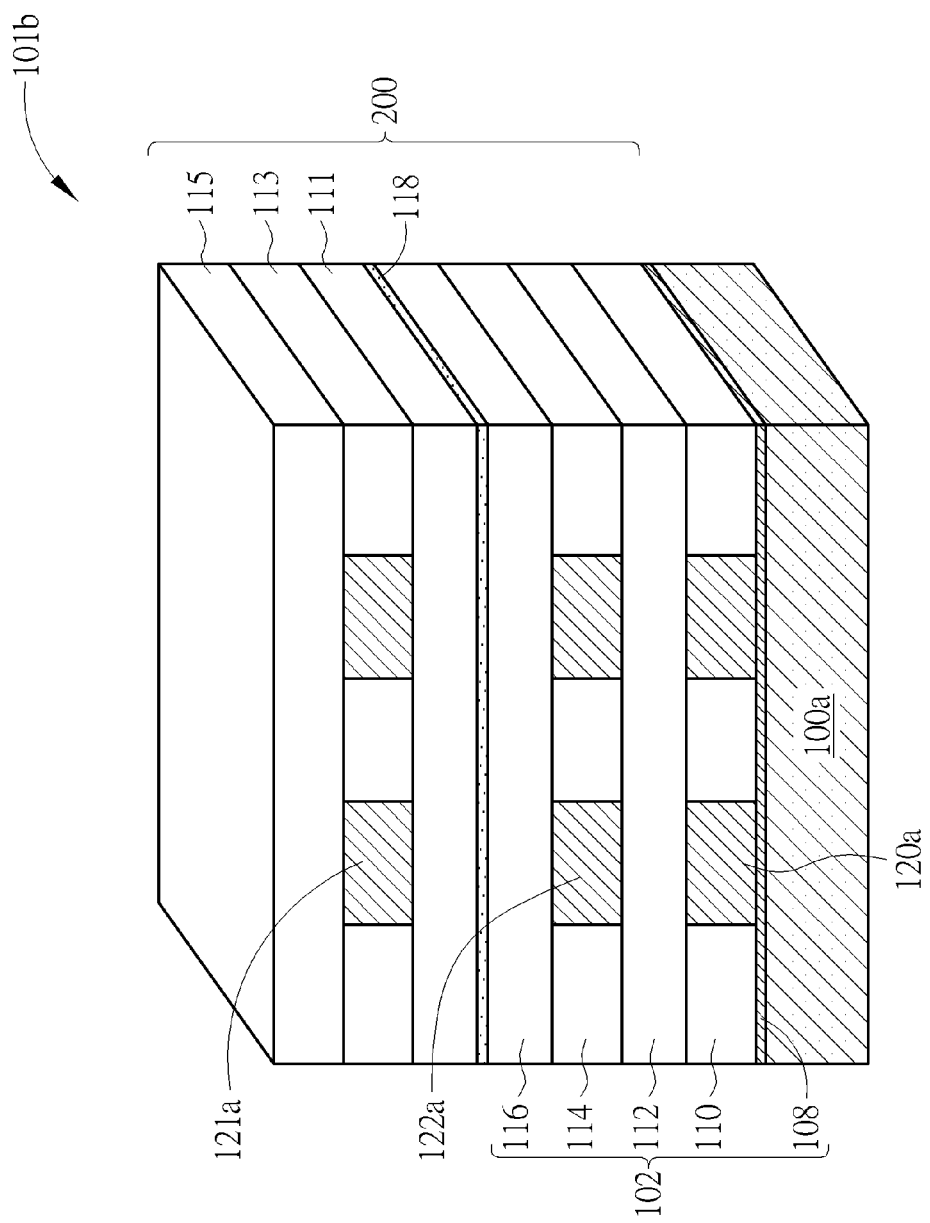

FIG. 3 and FIG. 4 illustrate various via components according to other embodiments. As shown in FIG. 3, the via component 101a has a similar cubic shaped or a rectangular parallelepiped structure comprising the substrate portion (e.g. silicon portion) 100a, the dielectric stack 102, and the metal vias 120a and 122a. The via component 101a further comprises a metal sheet 118 such as a copper foil that covers a top surface of the dielectric layer 116.

As shown in FIG. 4, the via component 101b may further comprise a plurality of dielectric layers 111, 113, 115 formed on the metal sheet 118, and a plurality of metal vias 121a formed in the dielectric layer 113. According to one embodiment, the metal sheet 118 may function as an electromagnetic interference (EMI) shielding and is able to avoid signal cross-talk between signals, for example, power signals, transmitted through the metal vias 121a, and the signals, for example, high-frequency signals, transmitted through the metal vias 120a and 122a.

Although the metal vias depicted through FIG. 1 to FIG. 4 are formed in dielectric layers, it is to be understood that the metal vias may be formed in other materials. For example, in other embodiments, the metal vias may be formed within a silicon material layer. According to one embodiment, the via component may be a TSV (through silicon via) chip.

Figure 5:
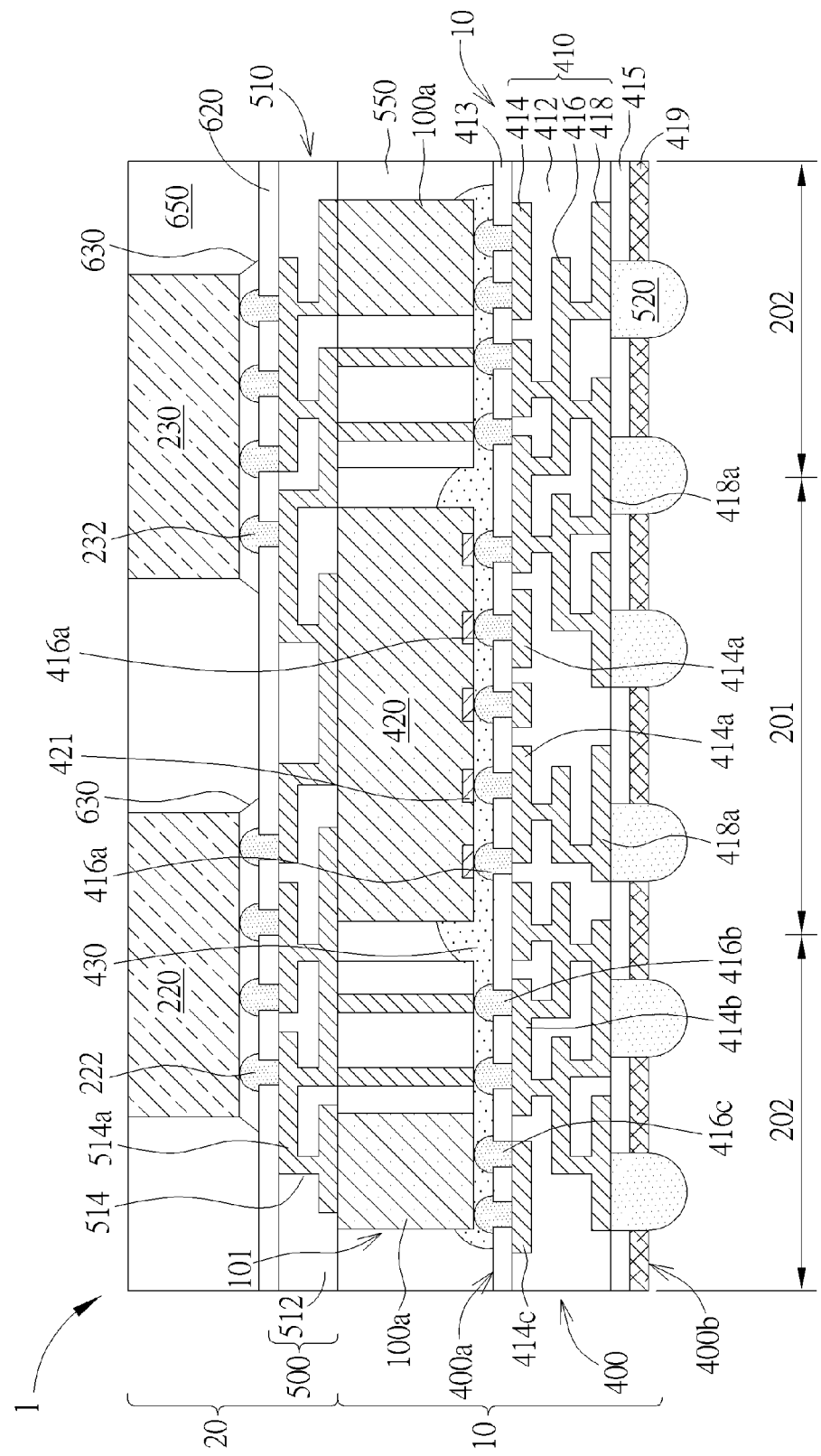
FIG. 5 is a schematic, cross-sectional diagram showing an exemplary multi-chip semiconductor package or WLPoP in accordance with one embodiment.

FIG. 5 is a schematic, cross-sectional diagram showing an exemplary multi-chip semiconductor package or WLPoP in accordance with one embodiment. As shown in FIG. 5, the multi-chip semiconductor package 1 comprises a bottom die package 10 and a top die package 20 integrally formed on the bottom die package 10. The bottom die package 10 is electrically connected to the dies 220 and 230 in the top die package 20 through the via components 101, more specifically, through the connection portions 200 of the via components 101, as set forth in FIG. 2, and through the upper RDL interposer 510 that is integrally formed on the bottom die package 10 in a wafer level.

According to one embodiment, the bottom die package 10 comprises a lower RDL interposer 400 having a first side 400a and a second side 400b that is opposite to the first side 400a. According to one embodiment, the lower RDL interposer 400 may comprise a redistribution layer (RDL) 410 and a passivation layer 413 on the RDL 410.

The RDL 410 may comprise at least one dielectric layer 412 and metal layers 414, 416, and 418. The dielectric layer 412 may comprise organic materials such as polyimide (PI) or inorganic materials such as silicon nitride, silicon oxide or the like, but not limited thereto. The metal layers 414, 416, and 418 may comprise aluminum, copper, tungsten, titanium, titanium nitride, or the like. The passivation layer 413 may comprise polyimide or solder mask material. It is understood that in some embodiments the RDL 410 may comprise a single metal layer.

According to one embodiment, the RDL 410 may comprise a plurality of bump pads 414a, 414b, and 414c in the metal layer 414. The passivation layer 413 may include openings (not explicitly shown) that expose the respective bump pads 414a, 414b, and 414c. A plurality of bumps 416a, 416b, and 416c such as microbumps may be formed on the respective bump pads 414a, 414b, and 414c in the passivation layer 413. According to one embodiment, the bump pads 414c are electrically isolated, dummy bump pads. According to one embodiment, the bumps 416c on the bump pads 414c are electrically isolated, dummy bumps.

According to one embodiment, at least one flipped chip (or flipped die) 420 is mounted within a chip mounting area 201 on the first side 400a of the lower RDL interposer 400. The chip 420 is electrically connected to the RDL 410 through the bumps 416a. On the active surface of the chip 420, a plurality of input/output (I/O) pads 421 may be provided. The I/O pads 421 are aligned with the bumps 416a. Although not shown in this figure, it is understood that bumps or pillar such as copper pillars may be formed on the I/O pads 421.

According to one embodiment, the via components 101 as described above are mounted on the first side 400a of the lower RDL interposer 400 within a peripheral area 202 adjacent to the chip mounting area 201. Each of the via components 101 is electrically connected to the RDL 410 through the bumps 416b. The substrate portion 100a of each of the via components 101 is disposed directly on the bumps 416c. Although only one chip 420 is shown in FIG. 5, it is understood that in some cases, additional chips or passive components may be mounted on the first side 400a of the lower RDL interposer 400. The additional chips mounted on the first side 400a of the lower RDL interposer 400 may comprise Application-specific integrated circuit (ASIC) chips, Field-programmable gate arrays (FPGA) chips, etc.

Figure 6:
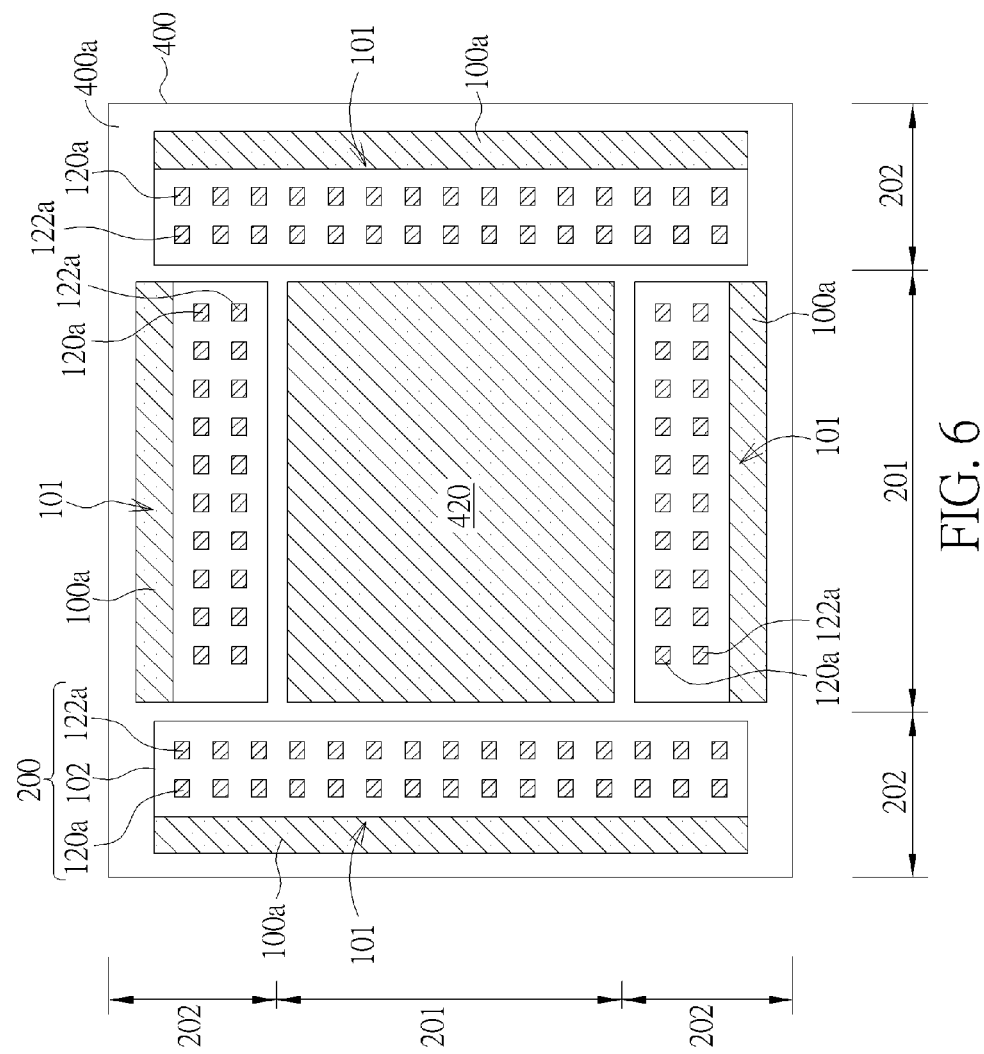
FIG. 6 is a schematic top view showing an exemplary arrangement or layout of the via components in FIG. 2 and the chip in the multi-chip semiconductor package.

FIG. 6 is a schematic top view showing an exemplary arrangement or layout of the via components 101 and the chip 420. As shown in FIG. 6, according to one embodiment, the via components 101 may be disposed along four sides of the chip 420 within the peripheral area 202. However, it is understood that the via components 101 may be disposed only along three sides, only along two opposite sides, or only along two adjacent sides of the chip 420 within the peripheral area 202 in other embodiments.

As described above, each of the via components 101 has a substrate portion 100a and connection portion 200. The connection portion 200 comprises the dielectric stack 102 and the metal vias 120a and 122a. According to one embodiment, the connection portion 200 is disposed relatively closer to the chip 420 and the substrate portion 100a is disposed relatively farther from the chip 420. However, it is understood that, in other embodiments, the connection portion 200 may be disposed relatively farther from the chip 420 and the substrate portion 100a is disposed relatively closer to the chip 420 depending upon design requirements.

Figure 7:
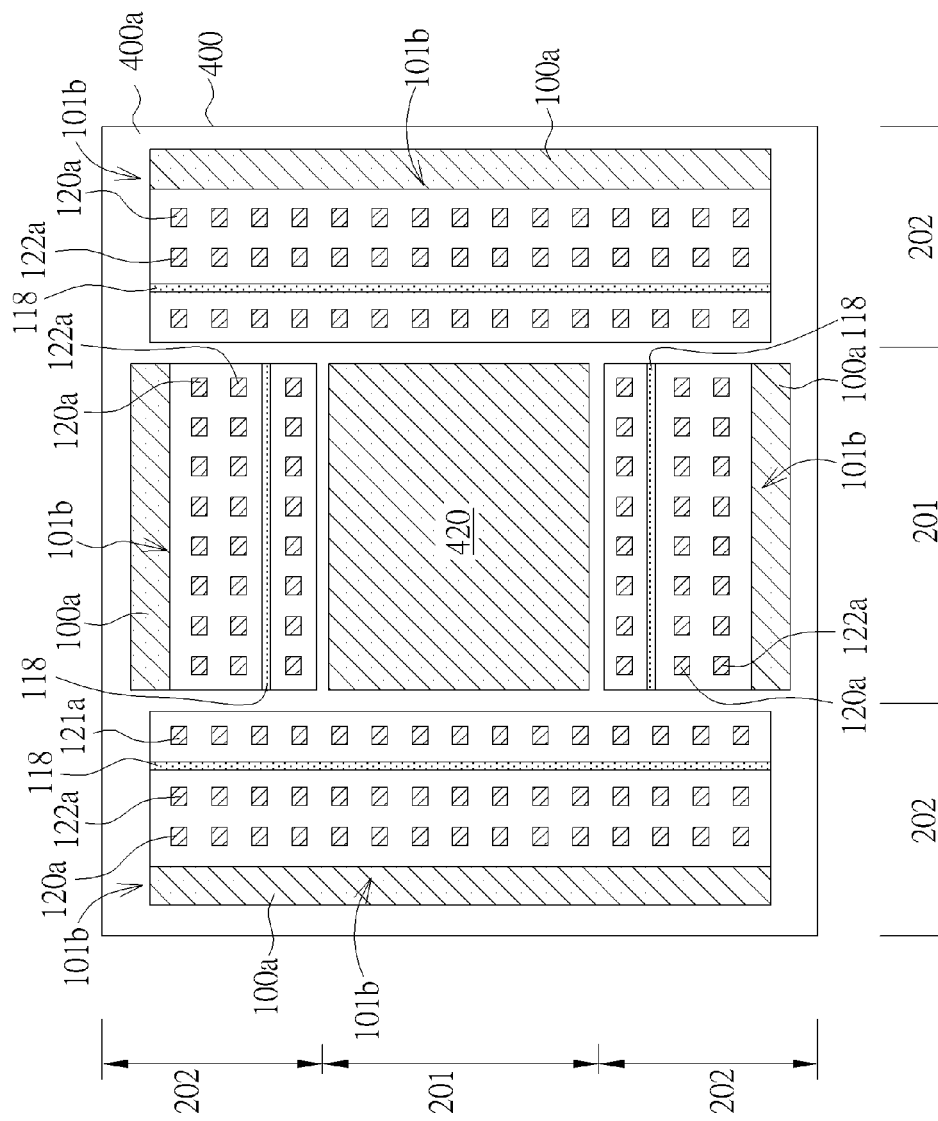
FIG. 7 is a schematic top view showing an exemplary arrangement or layout of the via components in FIG. 4 and the chip in the multi-chip semiconductor package according to another embodiment.

FIG. 7 is a schematic top view showing an exemplary arrangement or layout of the via components 101b in FIG. 4 and the chip 420 according to another embodiment. As shown in FIG. 7, according to another embodiment, the via components 101b may be disposed along four sides of the chip 420 within the peripheral area 202. However, it is understood that the via components 101b may be disposed only along three sides, only along two opposite sides, or only along two adjacent sides of the chip 420 within the peripheral area 202 in other embodiments.

As described above, each of the via components 101b has a substrate portion 100a and connection portion 200. The connection portion 200 comprises the dielectric stack 102, the metal vias 120a and 122a, the metal sheet 118, the dielectric layers 111, 113, 115, and the metal vias 121a in the dielectric layer 113. According to one embodiment, the connection portion 200 is disposed relatively closer to the chip 420 and the substrate portion 100a is disposed relatively farther from the chip 420.

For example, the metal vias 121a arranged in the inner rows may be used to convey power signals or ground signals, and the metal vias 120a and 122a arranged in the outer rows may be used to convey high-frequency signals. The metal sheet 118 between the metal vias 121a and the metal vias 120a and 122a may function as an electromagnetic interference (EMI) shielding and is able to avoid signal cross-talk between metal vias 121a and the metal vias 120a and 122a.

Still referring to FIG. 5, optionally, an underfill 430 may be applied under the chip 420 and under the via components 101. In some embodiments, the underfill 430 may be omitted. A molding compound 550 surrounds the chips 420 and the via components 101 and covers the first side 400a of the lower RDL interposer 400. The molding compound 550 may be subjected to a curing process. The mold compound 550 may comprise a mixture of epoxy and silica fillers, but not limited thereto.

The top portion of the molding compound 550 may be polished away to expose a top surface of the chip 420 and a top surface of the via components 101 by performing a molding compound grinding process. During the molding compound grinding process, a portion of the chips 420 may be removed, but not limited thereto. The top surface of the chip 420 is flush with the top surface of the molding compound 550 and the top surface of the via components 101.

According to one embodiment, an RDL 510 may be integrally fabricated on the top surface of the chip 420, the top surfaces of the via components 101, and the top surface of the molding compound 550 in a wafer level. For example, the RDL 510 may comprise at least one dielectric layer 512 and at least one metal layer 514. The dielectric layer 512 may comprise organic materials such as polyimide (PI) or inorganic materials such as silicon nitride, silicon oxide or the like, but not limited thereto. The metal layer 514 may comprise aluminum, copper, tungsten, titanium, titanium nitride, or the like. The metal layer 514 is electrically connected to the metal vias 120a and 122a of the via components 101. According to one embodiment, the RDL 510 may comprise a plurality of bump pads 514a in the metal layer 514.

According to one embodiment, a passivation layer 620 may be formed on the RDL 510. The RDL 510 and the passivation layer 620 constitute an upper RDL interposer 500. The chip 420 is sandwiched between the lower RDL interposer 400 and the upper RDL interposer 500. According to one embodiment, flipped chips or dies 220 and 230 are mounted on the upper RDL interposer 500. The chip 220 is electrically connected to the RDL 510 through the bumps 222 and the chip 230 is electrically connected to the RDL 510 through the bumps 232. A molding compound 650 surrounds the chips 220 and 230 and covers the top surface of the passivation layer 620.

According to one embodiment, the molding compound 650 may be cured at a temperature that is lower than the glass transition temperature ($T_g$) of the molding compound 550. According to one embodiment, the molding compound 650 may have a glass transition temperature ($T_g$) that is lower than that of the molding compound 550.

A passivation layer 415 and solder mask 419 may be formed on the second side 400b of the lower RDL interposer 400. A plurality of openings may be formed in the passivation layer 415 and solder mask 419 to expose respective solder pads 418a in the metal layer 418 of the RDL 410. A plurality of solder bumps (C4) or solder balls (BGA) 520 may be mounted on the second side 400b on the respective solder pads 418a. Although not explicitly shown in this figure, it is understood that an under bump metal (UBM) may be provided on each of the solder pads 418a.

Please refer to FIG. 8 to FIG. 14. FIG. 8 to FIG. 14 are schematic, cross-sectional diagrams showing an exemplary method for fabricating a multi-chip semiconductor package or WLPoP according to one embodiment.

Figure 8:
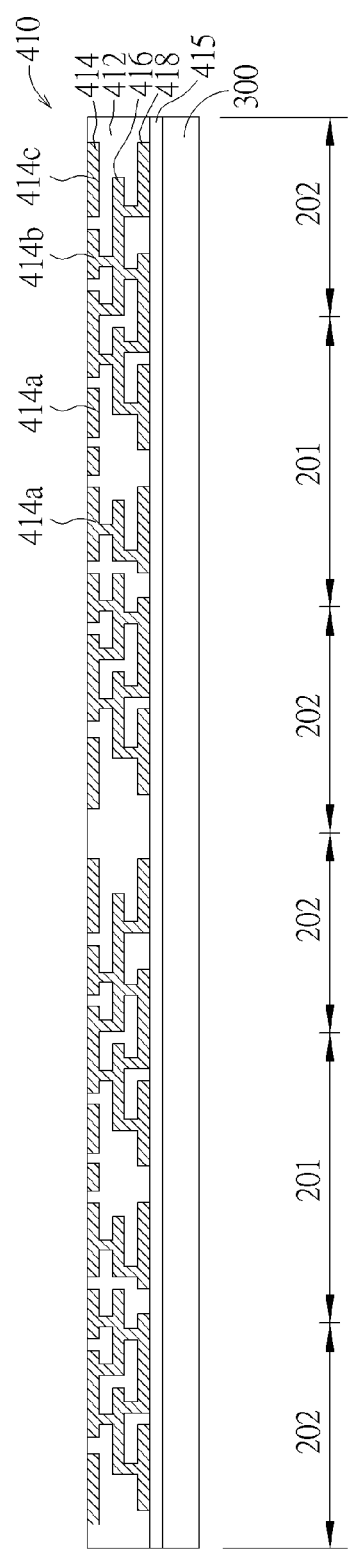
FIG. 8 to FIG. 14 are schematic, cross-sectional diagrams showing an exemplary method for fabricating a multi-chip semiconductor package or WLPoP according to one embodiment.

As shown in FIG. 8, a carrier 300 is prepared. The carrier 300 may be a releasable substrate material with an adhesive layer (not explicitly shown), but not limited thereto. At least a dielectric layer or a passivation layer 415 is then formed on a top surface of the carrier 300. The passivation layer 415 may comprise organic materials such as polyimide (PI) or inorganic materials such as silicon nitride, silicon oxide or the like.

Subsequently, a redistribution layer (RDL) 410 is formed on the passivation layer 310. The RDL 410 may comprise at least one dielectric layer 412 and metal layers 414, 416, and 418. The dielectric layer 412 may comprise organic materials such as polyimide (PI) or inorganic materials such as silicon nitride, silicon oxide or the like, but not limited thereto. The metal layers 414, 416, and 418 may comprise aluminum, copper, tungsten, titanium, titanium nitride, or the like. It is understood that the patterns and numbers of layers of the metal layers 414, 416, and 418 are for illustration purposes only.

According to the illustrated embodiment, the metal layer 414 may comprise a plurality of bump pads 414a, 414b, and 414c exposed from a top surface of the dielectric layer 412. The bump pads 414a are disposed within a chip mounting area 201, while the bump pads 414b and dummy pads 414c are disposed within a peripheral area 202 around the chip mounting area 201.

Figure 9:
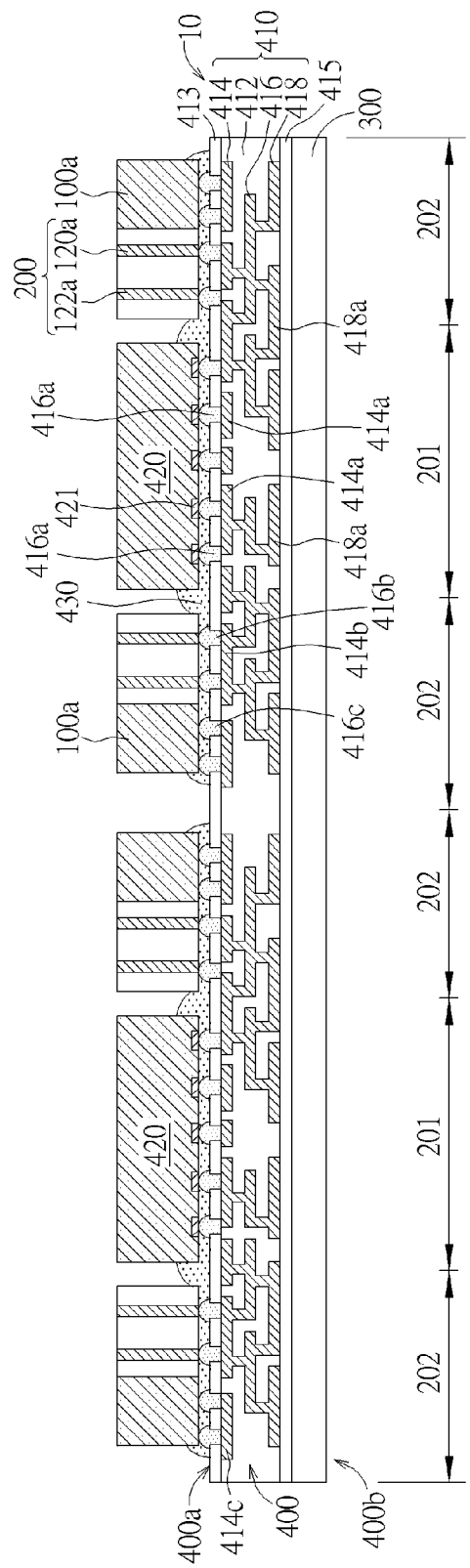

As shown in FIG. 9, a passivation layer 413 such as polyimide or solder mask material may be formed on the dielectric layer 412. The passivation layer 413 may include openings (not explicitly shown) that expose the respective bump pads 414a, 414b, and 414c. A conventional electroplating solder bumping process may be performed to form bumps (e.g. microbumps) 416a, 416b, and 416c on the respective bump pads 414a, 414b, and 414c.

Subsequently, a flipped chip or die 420 with its active side facing down toward the RDL 410 is then mounted on the RDL 410 through the bumps 416a, thereby forming a stacked chip-to-wafer (C2 W) construction. On the active surface of the chip 420, a plurality of input/output (I/O) pads 421 may be provided. Although not shown in this figure, it is understood that bumps or pillars such as copper pillars may be formed on the I/O pads 421. The I/O pads 421 are aligned with the bumps 416a. According to the illustrated embodiment, the chip 420 is an active integrated circuit chip with certain functions, for example, GPU (graphic processing unit), CPU (central processing unit), memory chips, etc., but not limited thereto.

The via components 101 as described above are mounted on the RDL 410 within a peripheral area 202 adjacent to the chip mounting area 201. Each of the via components 101 is electrically connected to the RDL 410 through the bumps 416b. The substrate portion 100a of each of the via components 101 is disposed directly on the bumps (dummy bumps) 416c.

According to the illustrated embodiment, the redistribution layer (RDL) 410, the passivation layer 413 on the RDL 410, and the passivation layer 415 together function as a lower RDL interposer 400. Optionally, an underfill 430 may be applied under the chip 420 and under the via components 101. In some embodiments, the underfill 430 may be omitted.

Figure 10:
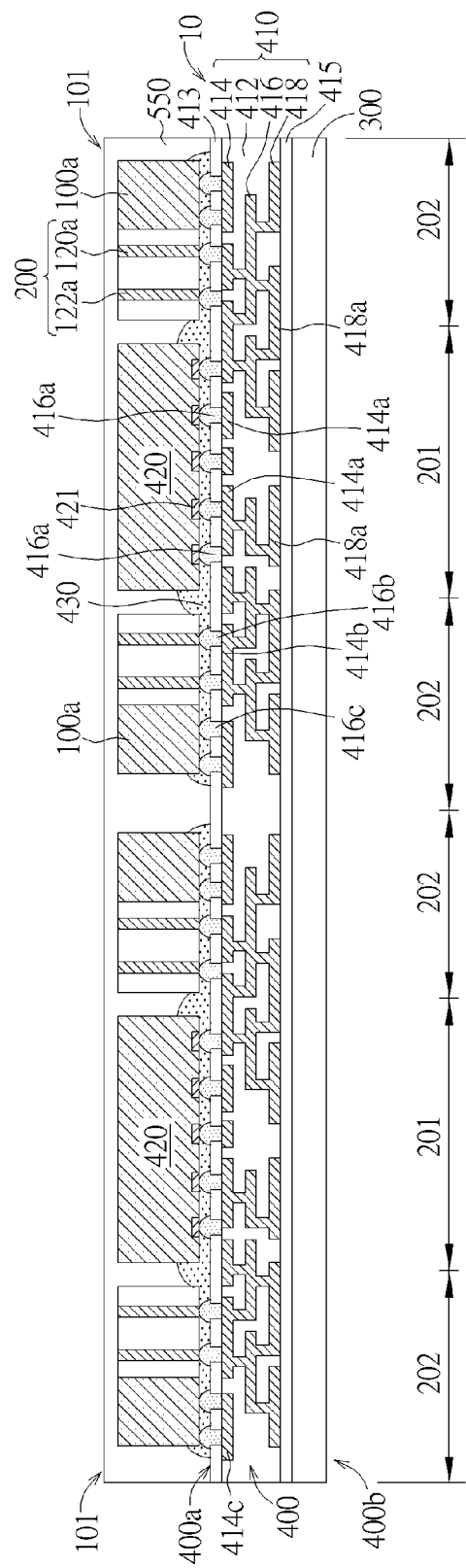

As shown in FIG. 10, subsequently, a molding compound 550 is applied. The molding compound 550 covers the chip 420, the via components 101, and the top surface of the lower RDL interposer 400. The molding compound 550 also fills into the gaps between the chip 420 and the via components 101. Subsequently, the molding compound 550 may be subjected to a curing process at a first temperature $T_1$. The mold compound 550 may comprise a mixture of epoxy and silica fillers, but not limited thereto.

Figure 11:
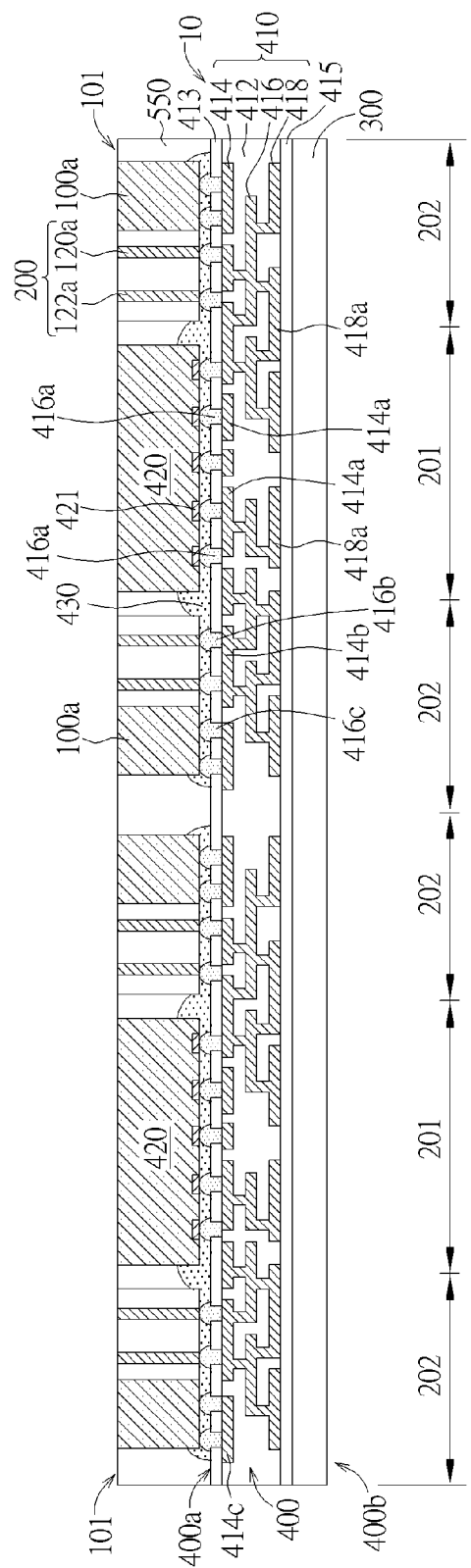

As shown in FIG. 11, a molding compound grinding process may be performed. A top portion of the molding compound 550 may be polished away to expose a top surface of the chip 420 and top surfaces of the via components 101. During the molding compound grinding process, a portion of the chip 420 may be removed, but not limited thereto. At this point, the top surface of the chip 420 and the top surfaces of the via components 101 are flush with the top surface of the molding compound 550.

Figure 12:
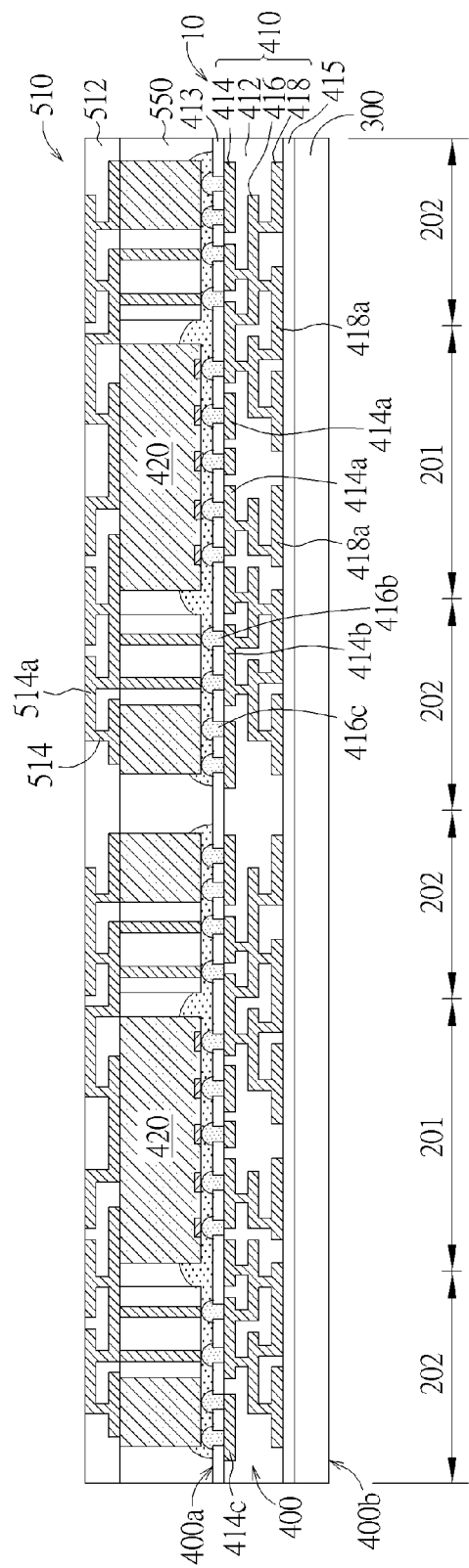

As shown in FIG. 12, subsequently, an RDL 510 may be fabricated on the top surface of the chip 420, the top surfaces of the via components 101, and the top surface of the molding compound 550. For example, the RDL 510 may comprise at least one dielectric layer 512 and at least one metal layer 514. The dielectric layer 512 may comprise organic materials such as polyimide (PI) or inorganic materials such as silicon nitride, silicon oxide or the like, but not limited thereto. The metal layer 514 may comprise aluminum, copper, tungsten, titanium, titanium nitride, or the like. The metal layer 514 is electrically connected to the metal vias 120a and 122a of the via components 101. According to one embodiment, the RDL 510 may comprise a plurality of bump pads 514a in the metal layer 514.

Figure 13:
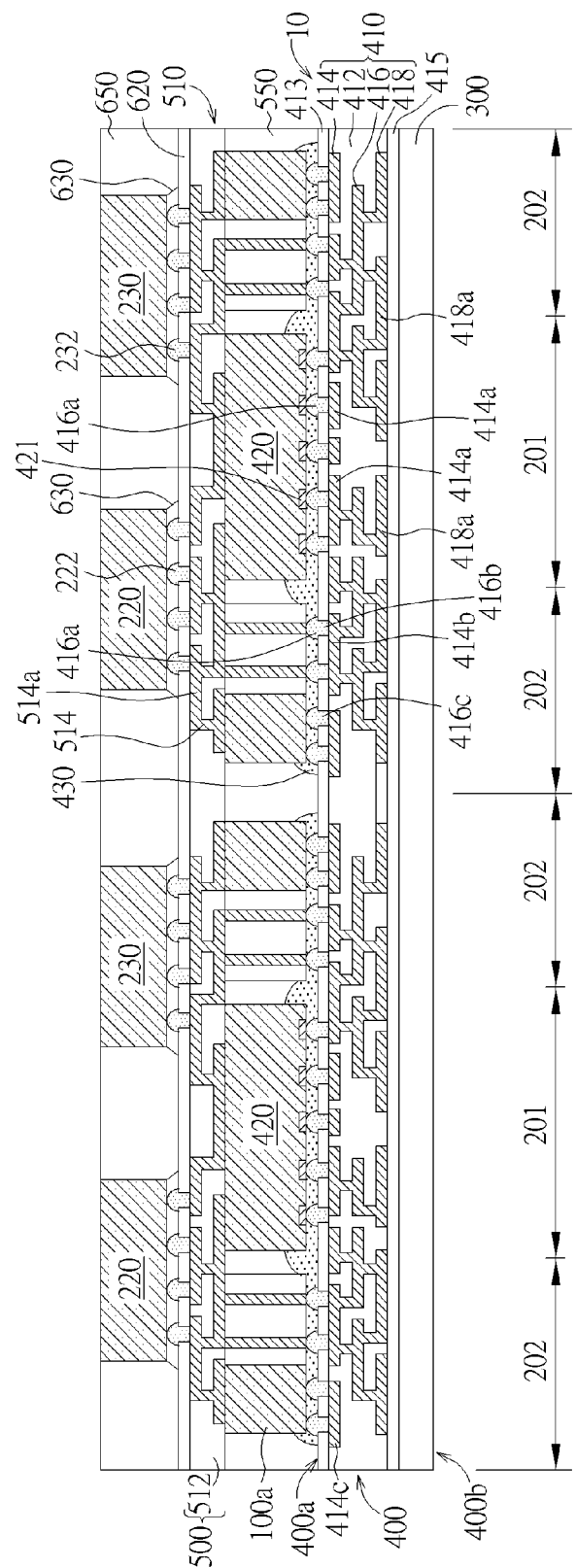

As shown in FIG. 13, a passivation layer 620 such as polyimide or solder mask material may be formed on the dielectric layer 512. The passivation layer 620 may include openings (not explicitly shown) that expose the respective bump pads 514a. A conventional electroplating solder bumping process may be performed to form bumps 222, 232 on the respective bump pads 514a. The RDL 510 and the passivation layer 620 constitute an upper RDL interposer 500. Subsequently, flipped chips or dies 220, 230 with their active side facing down toward the RDL 510 are then mounted on the RDL 510 through the bumps 222, 232, respectively. Optionally, an underfill 630 may be applied under the chips 220, 230. In some embodiments, the underfill 630 may be omitted.

Subsequently, a molding compound 650 is applied. The molding compound 650 covers the chips 220, 230 and the top surface of the upper RDL interposer 500. Subsequently, the molding compound 650 may be subjected to a curing process at a second temperature $T_2$. According to one embodiment, the second temperature $T_2$ is lower than the first temperature $T_1$. The mold compound 650 may comprise a mixture of epoxy and silica fillers, but not limited thereto. Optionally, the mold compound 650 may be subjected to a grinding process to remove an upper portion of the mold compound 650.

According to one embodiment, the molding compound 650 may be cured at a temperature lower than the glass transition temperature ($T_g$) of the molding compound 550. According to one embodiment, the molding compound 650 may have a glass transition temperature ($T_g$) that is lower than that of the molding compound 550.

Figure 14:
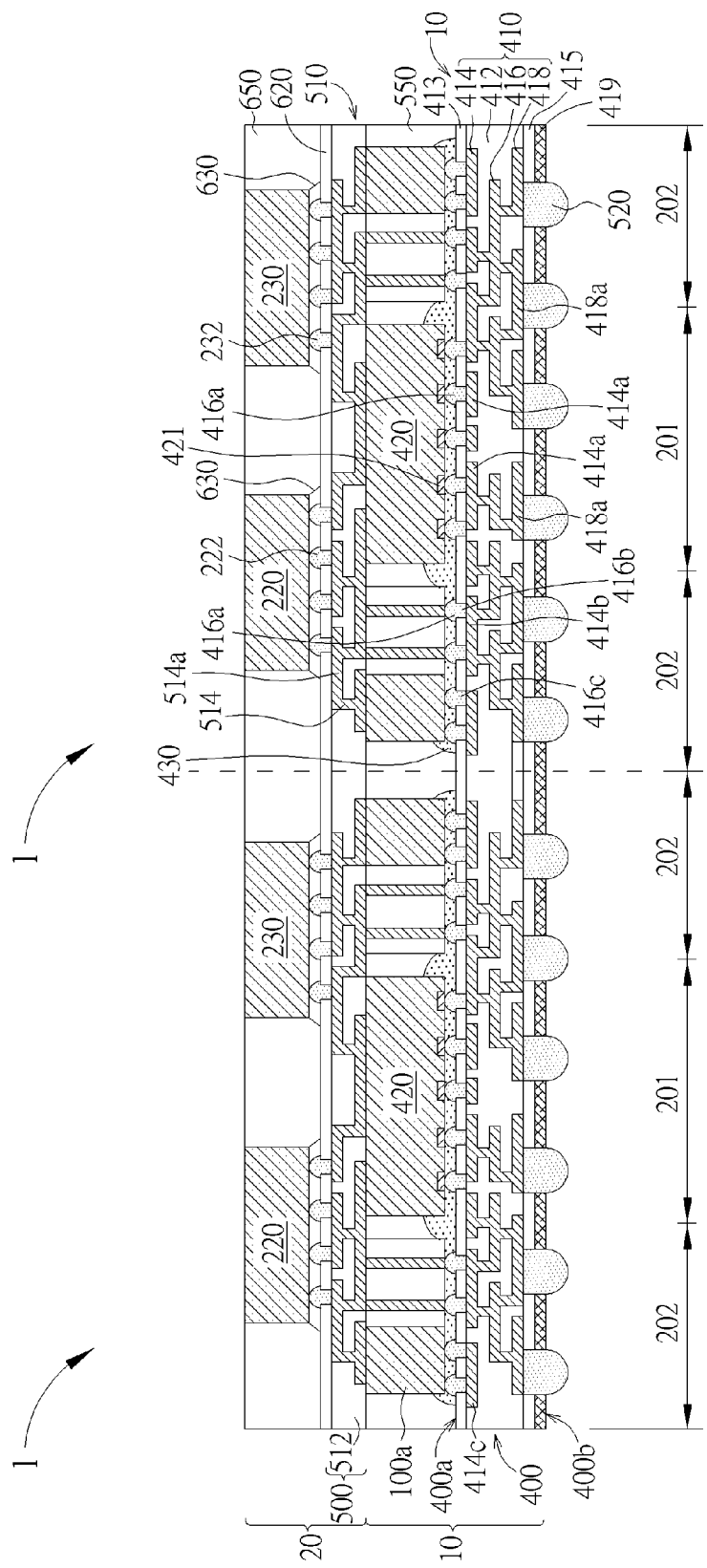

As shown in FIG. 14, the carrier 300 is removed to thereby expose a lower surface of the passivation layer 415. The de-bonding of the carrier 300 may be performed by using a laser process, UV irradiation process, grinding process, or etching process, but not limited thereto. After de-bonding the carrier 300, a solder mask 419 may be formed on the passivation layer 415. Openings may be formed in the passivation layer 415 and the solder mask 419 to expose respective solder pads 418a, 418b, and 418c, and then solder bumps (e.g. C4) or solder balls (e.g. BGA balls) 520 may be formed on the respective solder pads 418a, 418b, and 418c. Although not explicitly shown in this figure, it is understood that an UBM may be formed before disposing the solder balls 520.

The wafer level package is then diced as indicated by the dashed line and singulated into individual multi-chip semiconductor packages 1.

Figure 15:
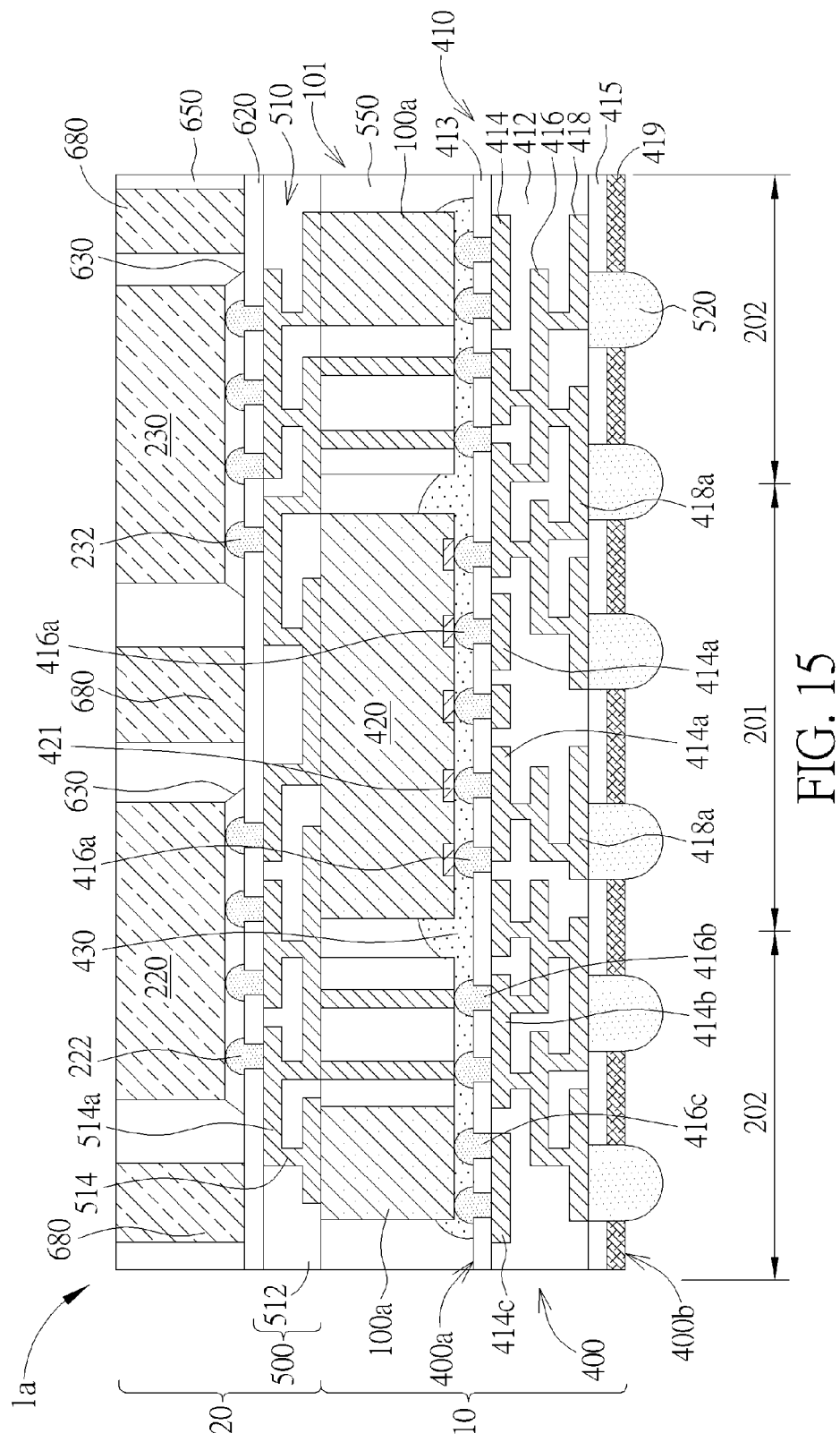
FIG. 15 is a schematic, cross-sectional diagram showing an exemplary multi-chip semiconductor package according to another embodiment.

FIG. 15 is a schematic, cross-sectional diagram showing an exemplary multi-chip semiconductor package 1a according to another embodiment. As shown in FIG. 15, the multi-chip semiconductor package 1a in FIG. 15 is different from the multi-chip semiconductor package 1 in FIG. 5 in that the multi-chip semiconductor package 1a further comprises a plurality of dummy components 680 such as metal bars, patterns, or dummy chips that are disposed on the upper RDL interposer 500. The dummy components 680 are disposed on the upper RDL interposer 500 for warpage control. For example, the dummy components 680 may comprise silicon, but not limited thereto. The dummy components 680 may be adhered to the surface of the passivation layer 620 by using an adhesive (not explicitly shown), but not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-chip semiconductor package, comprising:
    a lower RDL interposer having a first side, a second side opposite to the first side, and a first sidewall surface extending between the first side and the second side;
    a first chip mounted on the first side within a chip mounting area of the lower RDL interposer;
    a plurality of via components mounted on the first side only within a peripheral area being adjacent to the chip mounting area of the lower RDL interposer, wherein the via components and the first chip are coplanar, wherein each of the via components comprises a substrate portion and a connection portion coupled to the substrate portion;
    a first molding compound disposed on the first side, the first molding compound surrounding the first chip and the via components, wherein the first molding compound has a second sidewall surface;
    a plurality of solder bumps mounted on the second side of the lower RDL interposer;
    an upper RDL interposer being integrally constructed on the first chip, the via components, and on the first molding compound and being electrically connected to the connection portion of each of the via components, wherein the upper RDL interposer has a third sidewall surface, and wherein there is no air gap disposed between the upper RDL interposer and the lower RDL interposer;
    a second chip mounted on the upper RDL interposer; and
    a second molding compound surrounding the second chip, wherein the second molding compound has a fourth sidewall surface, and wherein the first sidewall surface, the second sidewall surface, the third sidewall surface, and the fourth sidewall surface are contiguous and flush with one another.

2. The multi-chip semiconductor package according to claim 1, wherein the substrate portion comprises silicon, glass, ceramic, or metal.

3. The multi-chip semiconductor package according to claim 1, wherein the connection portion comprises a dielectric stack and metal vias embedded in the dielectric stack.

4. The multi-chip semiconductor package according to claim 1, wherein each of the via components has a cubic shaped or a rectangular parallelepiped structure.

5. The multi-chip semiconductor package according to claim 1, wherein the substrate portion is in direct contact with the connection portion.

6. The multi-chip semiconductor package according to claim 1, wherein the first chip is electrically connected to the lower RDL interposer through a plurality of first bumps, and the connection portion is electrically connected to the lower RDL interposer through a plurality of second bumps.

7. The multi-chip semiconductor package according to claim 1, wherein the second molding compound has a glass transition temperature that is lower than that of the first molding compound.

8. The multi-chip semiconductor package according to claim 1, wherein the via components are disposed only along three sides, only along two opposite sides, or only along two adjacent sides of the chip within the peripheral area.

9. The multi-chip semiconductor package according to claim 1, wherein the via components comprise TSV chips.

10. The multi-chip semiconductor package according to claim 1 further comprising a dummy component disposed on the upper RDL interposer.

11. The multi-chip semiconductor package according to claim 3, wherein the dielectric stack comprises an organic material.

12. The multi-chip semiconductor package according to claim 3, wherein the dielectric stack comprises an inorganic material.

13. The multi-chip semiconductor package according to claim 3, wherein each of the via component further comprises a metal shielding layer in the dielectric stack.

14. The multi-chip semiconductor package according to claim 11, wherein the organic material comprises polyimide (PI), polybenzoxazole (PBO), or benzocyclobuten (BCB).

15. The multi-chip semiconductor package according to claim 12, wherein the inorganic material comprises silicon oxide, silicon nitride, or silicon oxy-nitride.

16. The multi-chip semiconductor package according to claim 6, wherein the substrate portion is mounted onto the lower RDL interposer through a plurality of third bumps.

17. The multi-chip semiconductor package according to claim 16, wherein the second chip is mounted onto the upper RDL interposer through a plurality of fourth bumps.

18. The multi-chip semiconductor package according to claim 10, wherein the dummy component comprises a metal bar, a pattern, or a dummy chip.

19. The multi-chip semiconductor package according to claim 10, wherein the dummy component comprises silicon.

* * * * *

UNITED STATES PATENT AND TRADEMARK OFFICE
CERTIFICATE OF CORRECTION

PATENT NO. : 9,607,967 B1
APPLICATION NO. : 14/977645
DATED : March 28, 2017
INVENTOR(S) : Shing-Yih Shih It is certified that error appears in the above-identified patent and that said Letters Patent is hereby corrected as shown below:

In the Specification
Column 2, Line 20, change "constitute apart of" to --constitute a part of--
Column 8, Line 19, change "(C2 W)" to --(C2W)--

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*